United States Patent
Wakerly et al.

(10) Patent No.: US 7,657,821 B1
(45) Date of Patent: Feb. 2, 2010

(54) ERROR DETECTING CODE FOR MULTI-CHARACTER, MULTI-LANE, MULTI-LEVEL PHYSICAL TRANSMISSION

(75) Inventors: John F. Wakerly, Oakbrook Terrace, IL (US); Claudio DeSanti, Berkeley, CA (US)

(73) Assignee: Cisco Technology, Inc., San Jose, CA (US)

( * ) Notice: Subject to any disclaimer, the term of this patent is extended or adjusted under 35 U.S.C. 154(b) by 509 days.

(21) Appl. No.: 11/467,236

(22) Filed: Aug. 25, 2006

Related U.S. Application Data

(60) Provisional application No. 60/798,926, filed on May 9, 2006.

(51) Int. Cl.
*H03M 13/00* (2006.01)

(52) U.S. Cl. .................................. 714/758; 714/801

(58) Field of Classification Search ........... 714/758, 714/801
See application file for complete search history.

(56) References Cited

U.S. PATENT DOCUMENTS

| | | | |
|---|---|---|---|
| 4,601,044 A | | 7/1986 | Kromer, III et al. |
| 6,633,856 B2 * | | 10/2003 | Richardson et al. ............ 706/15 |
| 6,789,227 B2 * | | 9/2004 | De Souza et al. ............ 714/804 |
| 6,895,547 B2 * | | 5/2005 | Eleftheriou et al. ......... 714/801 |
| 7,178,082 B2 * | | 2/2007 | Yu et al. ...................... 714/752 |
| 7,260,763 B2 * | | 8/2007 | Sukhobok et al. ........... 714/758 |
| 7,313,752 B2 * | | 12/2007 | Kyung et al. ................. 714/801 |
| 2003/0014718 A1 * | | 1/2003 | De Souza et al. ............ 714/804 |
| 2004/0034828 A1 * | | 2/2004 | Hocevar ...................... 714/800 |
| 2005/0204253 A1 | | 9/2005 | Sukhobok et al. |
| 2006/0156179 A1 * | | 7/2006 | Shen et al. .................. 714/758 |
| 2007/0011570 A1 * | | 1/2007 | Jeong et al. ................. 714/758 |
| 2007/0101246 A1 * | | 5/2007 | Kyung et al. ................ 714/804 |
| 2008/0065970 A1 * | | 3/2008 | Tan ............................ 714/800 |
| 2008/0270867 A1 * | | 10/2008 | Chung et al. ................ 714/752 |

FOREIGN PATENT DOCUMENTS

WO WO-2007133937 A2 11/2007

OTHER PUBLICATIONS

Claudio Desanti. Proposed FC-BaseT PCS, T11/06-026v2, May 2006. http://www.t11.org/ftp/t11/pub/fc/baset/06-026v2.pdf. Last accessed Jan. 15, 2007.
John F. Wakerly. Digital Design—Principles & Practices, Second Edition. Chapter 2.15, pp. 54-64. 1994.
International Search Report and Written Opinion for PCT Application Serial No. PCT/US07/67964, mailed Aug. 8, 2008, 9 pages.

* cited by examiner

*Primary Examiner*—M. Mujtaba K Chaudry
(74) *Attorney, Agent, or Firm*—Schwegman, Lundberg & Woessner, P.A.

(57) ABSTRACT

A system (e.g., Fiber Channel Error Detecting Code (FC-EDC)) that maps the "standard" Hamming codes onto the bits of a 33-bit control block is provided. The system employs a "rotation" of the check positions in a two-dimensional parity-check matrix for the FC-EDC. The specification discloses a computer-implemented program to test further modifications and permutations of the "standard" distance-4 parity-check matrix to yield an FC-EDC with enhanced error-detecting properties, designed to detect the most likely errors in the known physical environment. By using a parity-check matrix with the "rotation" property, certain error-detecting properties of the parity-check matrix are ensured, and the computation time for searching for a matrix with enhanced error-detecting properties becomes much shorter.

4 Claims, 15 Drawing Sheets

| Bits ($x_2 x_1 x_0$) | Symbol |
|---|---|
| 111b | +7 |
| 110b | +5 |
| 101b | +3 |
| 100b | +1 |
| 011b | -1 |
| 010b | -3 |
| 001b | -5 |
| 000b | -7 |

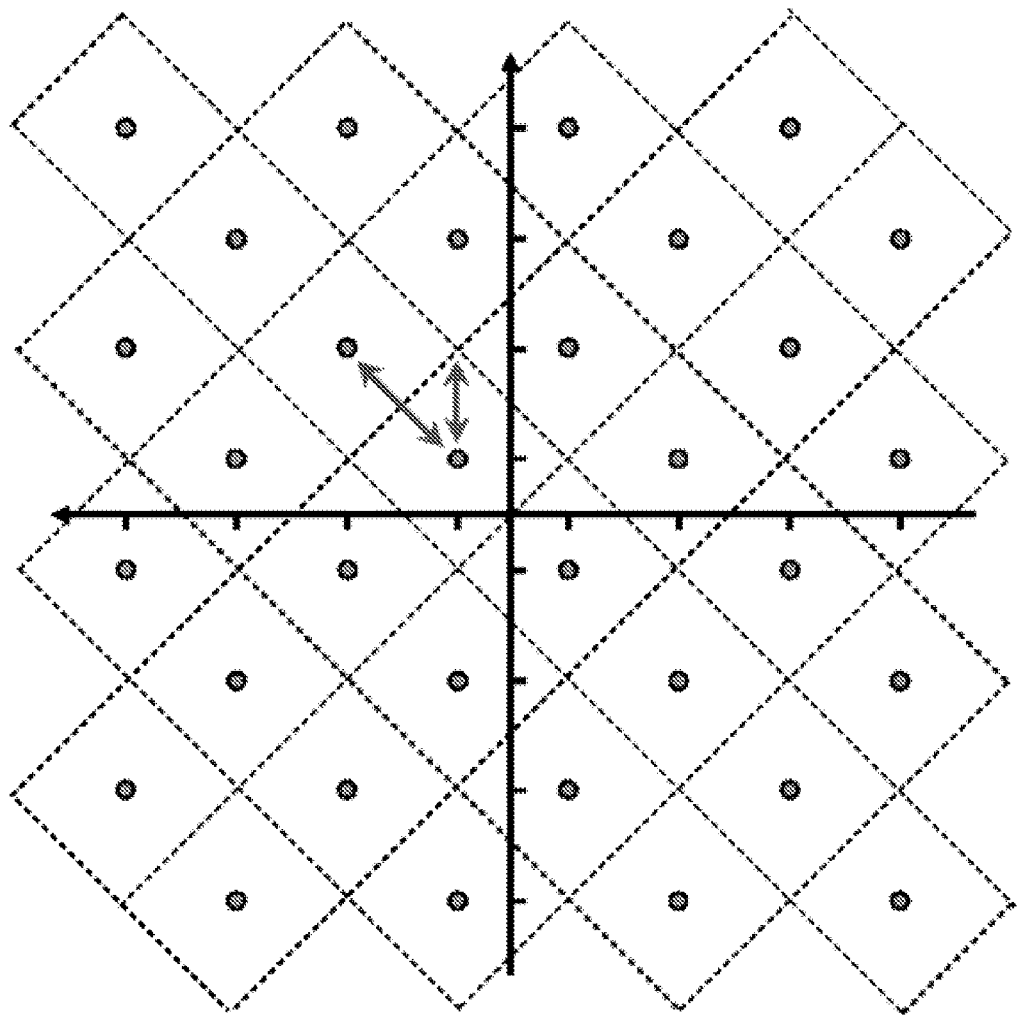

- $B_0 = \{-7, -3, +1, +5\}$
- $B_1 = \{-5, -1, +3, +7\}$
- $B_0^2 = B_0 \times B_0 \cup B_1 \times B_1$
- Minimal squared euclidean distance ($\Delta^2$) in a PAM-8 constellation is 4 (e.g., between points (1, 1) and (3, 1))
- Minimal squared euclidean distance in a Schlaefli constrained lattice is 8 ($2 * \Delta^2$) (e.g., between points (1, 1) and (3, 3))
- A point is decoded as an adjacent point when two coordinates differs more than $(sqrt(2) * \Delta)/2$ (e.g., point (1, 1) may be decoded as (3, 3))

FIG. 5

ERROR DETECTING CODE FOR MULTI-CHARACTER, MULTI-LANE, MULTI-LEVEL PHYSICAL TRANSMISSION

CROSS-REFERENCE TO RELATED APPLICATIONS

This application claims the benefit of U.S. Provisional Patent application Ser. No. 60/798,926 entitled "ERROR DETECTING CODE FOR MULTI-CHARACTER, MULTI-LANE, MULTI-LEVEL PHYSICAL TRANSMISSION" and filed May 9, 2006. The entirety of the above-noted application is incorporated by reference herein.

BACKGROUND

Testing for accurate data transmission across physical media is extremely important in today's digital world. Conventional error-detecting codes (EDCs) are limited in their detection capabilities with respect to today's transmission protocols.

Error detection refers to an ability to identify data errors that are encountered due to noise or other problems during transmission. At an abstract level, an "error" occurs when a bit is transmitted with a value of 1, but is received with a value of 0, or vice versa. For an error-detecting code to be most effective, however, the abstract errors that the code detects should be the ones that are most likely to occur on the physical transmission medium. For example, certain physical disturbances may create errors in multiple bits that are distributed among the received data based on the way that the bits are distributed in the physical medium in time and in space.

In accordance with today's physical transmission environment, data is oftentimes transmitted in 33-bit "control blocks" such as the ones used by FC-BaseT in order to carry the Fibre Channel protocol over unshielded twisted-pair cabling. The FC-BaseT environment uses four pairs of signal wires or lanes where each wire pair carries 3-bit "symbols" encoded in a PAM-8 coding (8-level pulse-amplitude modulation).

Thus, at any given time, the four lanes could carry 12 bits of information. To improve the accuracy of the physical demodulation and decoding, the 12th bit is most often transmitted as the parity of the first 9 bits, in a Schlaefli coding. Therefore, in practice, only 11 bits of information, called a "character" is transmitted on the four lanes at one time.

In accordance with FC-BaseT, three 11-bit characters are transmitted in sequence on the four lanes, for a 33-bit block. A designated bit of the 33-bit block indicates whether the remaining 32 bits transcode a data block or transcode a so-called Fibre Channel Ordered Set, or "control block." An FC-BaseT "control block" contains three 8-bit control bytes (24 bits of information), three bits used to identify the specific type of control block, with all three bits set to 0 for Fibre Channel use, and five unused additional bits.

SUMMARY

The following presents a simplified summary of the specification in order to provide a basic understanding of some aspects of the technology. This summary is not an extensive overview of the disclosure. It is not intended to identify key/critical elements of the disclosure or to delineate the scope of the technology. Its sole purpose is to present some concepts of the technology in a simplified form as a prelude to the more detailed description that is presented later.

The technology disclosed and claimed herein, in one aspect thereof, comprises error-detecting code systems and schemes that provide for higher probability of error detection than conventional error detecting techniques. In particular, an aspect of the disclosure provides for mapping standard distance-3 and distance-4 Hamming codes to bits of a 33-bit control block. For instance, in FC-BaseT transmissions, three 11-bit characters per block are transmitted. If physical errors affect respective characters independently, the same check bits can be employed to detect errors in all three characters. In an embodiment, three independent 5-bit check symbols for the three characters can be generated. In operation, these symbols are bitwise XORed to yield a single 5-bit check symbol for a corresponding 33-bit transmission which allows for detection of 3-bit errors isolated to a single 11-bit character.

In the event of physical errors spanning over multiple character times, a parity-check matrix for successive characters can be "rotated" so that different columns of the matrix are employed to protect all bits transmitted in a same lane. The rotation is performed to ensure that when the matrix is applied to subsequent transmission characters, all corresponding columns in a given lane are unique as compared to columns used in the same lane of respective preceding characters. The resultant code can detect up to 3-bit errors in a single transmission character as well as up to 3-bit errors in a single lane.

Another aspect relates to an enhancement methodology and/or program that search possible parity-check matrices having rotation properties until one or more matrices with desired properties are identified. More particularly, permutations of parity-check matrices are analyzed to determine whether or not they can detect all errors matching pre-defined criteria.

To the accomplishment of the foregoing and related ends, certain illustrative aspects are described herein in connection with the following description and the annexed drawings. These aspects are indicative, however, of but a few of the various ways in which the principles of the technology can be employed and the subject specification is intended to include all such aspects and their equivalents. Other advantages and features of the technology will become apparent from the following detailed description when considered in conjunction with the drawings.

BRIEF DESCRIPTION OF THE DRAWINGS

FIG. 5 illustrates a 2-dimensional lattice space in accordance with an embodiment.

DETAILED DESCRIPTION

Figure 1:
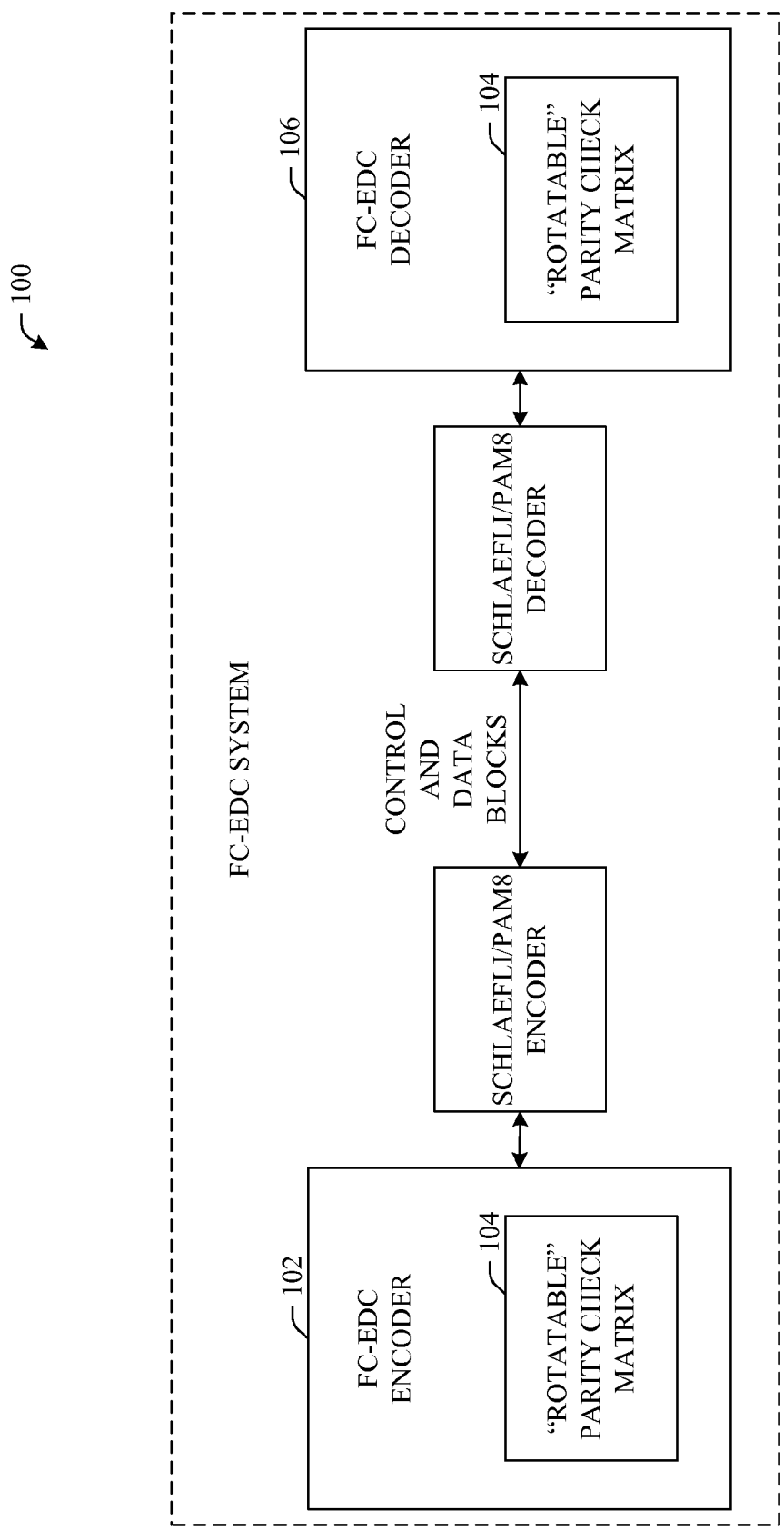
FIG. 1 illustrates an error-detecting code (EDC) system that detects and corrects errors in multi-character, multi-lane, multi-level physical transmission in accordance with an embodiment.

The technology is now described with reference to the drawings, wherein like reference numerals are used to refer to like elements throughout. In the following description, for purposes of explanation, numerous specific details are set forth in order to provide a thorough understanding of the features and functionality. It may be evident, however, that the technology can be practiced without these specific details. In other instances, well-known structures and devices are shown in block diagram form in order to facilitate describing the features and functionality.

As used in this application, the terms "component" and "system" are intended to refer to a computer-related entity, either hardware, a combination of hardware and software, software, software in execution, or a digital logic circuit. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution, and a component can be localized on one computer and/or distributed between two or more computers.

As stated above, testing for accurate data transmission across physical media is extremely important in today's digital world. Additionally, conventional error-detecting codes (EDCs) are limited in their detection capabilities with respect to today's evolving transmission protocols.

Referring to the drawings, FIG. 1 illustrates an error-detecting code system 100 that facilitates detecting and correcting errors for multi-character, multi-lane, multi-level physical transmission in accordance with an aspect. More particularly, in accordance with an aspect, the system 100 can detect errors with respect to the Fibre Channel protocol as adapted for transmission over twisted-pair media (FC-BaseT). As such, system 100 will be referred to herein as FC-EDC (Fibre Channel Error Detecting Code). Although the aspects described herein are directed to the Fibre Channel protocol, it is to be understood that alternative aspects can be directed to other transmission systems and protocols without departing from the spirit and/or scope of the specification.

Generally, the FC-EDC system 100 can include an FC-EDC encoder 102 that employs a parity-check matrix 104 that can generate check bits for a control block using the EDC of the subject disclosure. As well, system 100 can include an FC-EDC decoder 106 that can detect errors in a control block that has been transmitted using the EDC as described herein. As will be better understood upon a review of the discussion that follows, the system 100 can facilitate rotating the check positions in a two-dimensional parity-check matrix in order to detect errors in the physical environment.

In accordance with the exemplary physical transmission environment, an EDC can be particularly useful for detecting errors in 33-bit "control blocks," such as those used by FC-BaseT in order to carry the Fibre Channel protocol over unshielded twisted-pair cabling. In the aspect, it is to be understood that the FC-BaseT environment uses four pairs of signal wires or lanes where each wire pair carries 3-bit "symbols" encoded in a PAM-8 coding (8-level pulse-amplitude modulation).

Thus, at any given time, the four lanes could carry 12 bits of information. To improve the accuracy of the physical demodulation and decoding, the 12th bit is most often transmitted as the parity of the first 9 bits, in a Schlaefli coding. Therefore, in practice, only 11 bits of information, called a "character," is transmitted on the four lanes at one time.

In accordance with the FC-BaseT embodiment, three 11-bit characters are transmitted in sequence on the four lanes, for a 33-bit block. A designated bit of the 33-bit block indicates whether the remaining 32 bits transcode a data block, or transcode a so-called Fibre Channel Ordered Set, or "control block." A 33 bit FC-BaseT "control block" contains three 8-bit control bytes (24 bits of information), three bits used to identify the specific type of control block, with all three bits set to 0 for Fibre Channel use, and five unused additional bits.

The FC-EDC system 100 employs these five additional bits as check bits in accordance with the EDC. This FC-EDC system 100 can facilitate a high probability of detecting any errors that occur in the transmission of a control block. In aspects, the FC-EDC 100 coding scheme can be chosen in a way that maximizes the probability of detecting an error in view of the likely physical error mechanisms that can occur in the FC-BaseT twisted-pair environment.

It will be understood that, in accordance with the specification, the individual bits of a 33-bit block can be mapped onto characters and symbols in the four lanes in conjunction with PAM-8 and Schlaefli codings. Additionally, the five check bits used in accordance with this disclosure are based upon distance-3 and distance-4 (extended) Hamming codes.

One particular aspect of the specification discloses a technique in which the "standard" Hamming codes are mapped onto the bits of the 33-bit control block. As well, the specification describes and employs a "rotation" of the check positions in a two-dimensional parity-check matrix for the FC-EDC system. Although described aspects are directed to 33 bit control blocks, it is to be understood that the features and functionalities described herein can be applied to other transmitted data without departing from the spirit and scope of this disclosure and claims appended hereto.

Furthermore, the disclosure describes and provides for a computer-implemented system and use thereof to test further modifications and permutations of the "standard" distance-4 parity-check matrix to yield an FC-EDC with enhanced properties. The parity-check matrix discovered by this computer-implemented system is designed to detect the most likely errors in the known physical environment.

By using a parity-check matrix 104 with the "rotation" property, the computation time for the search can be constrained to a particularly manageable range. It is to be appreciated that, without the rotation property of the parity-check matrix (e.g., 104), there would otherwise be somewhat between 27! (27 factorial) and 26^27 (26 to the 27th power) different parity-check matrices to test.

Following is a discussion of Schlaefli Coding and Decoding which provides useful information in understanding the FC-EDC system 100 as illustrated in FIG. 1. The operation of an FC-BaseT device may be decomposed in a Physical Coding Sublayer (PCS) and a Physical Medium Attachment (PMA) sublayer. The PCS converts digital data received from the upper layers in a format (physical coding) suitable for effective physical transmission on a specific media. The PMA sublayer takes the codes produced by the PCS and adapts then to the specific physical media used (e.g., by converting a value into a level of voltage on a cable). The FC-BaseT PCS interfaces with the upper levels through an XGMII interface (as defined in IEEE Std. 802.3).

Figure 2:
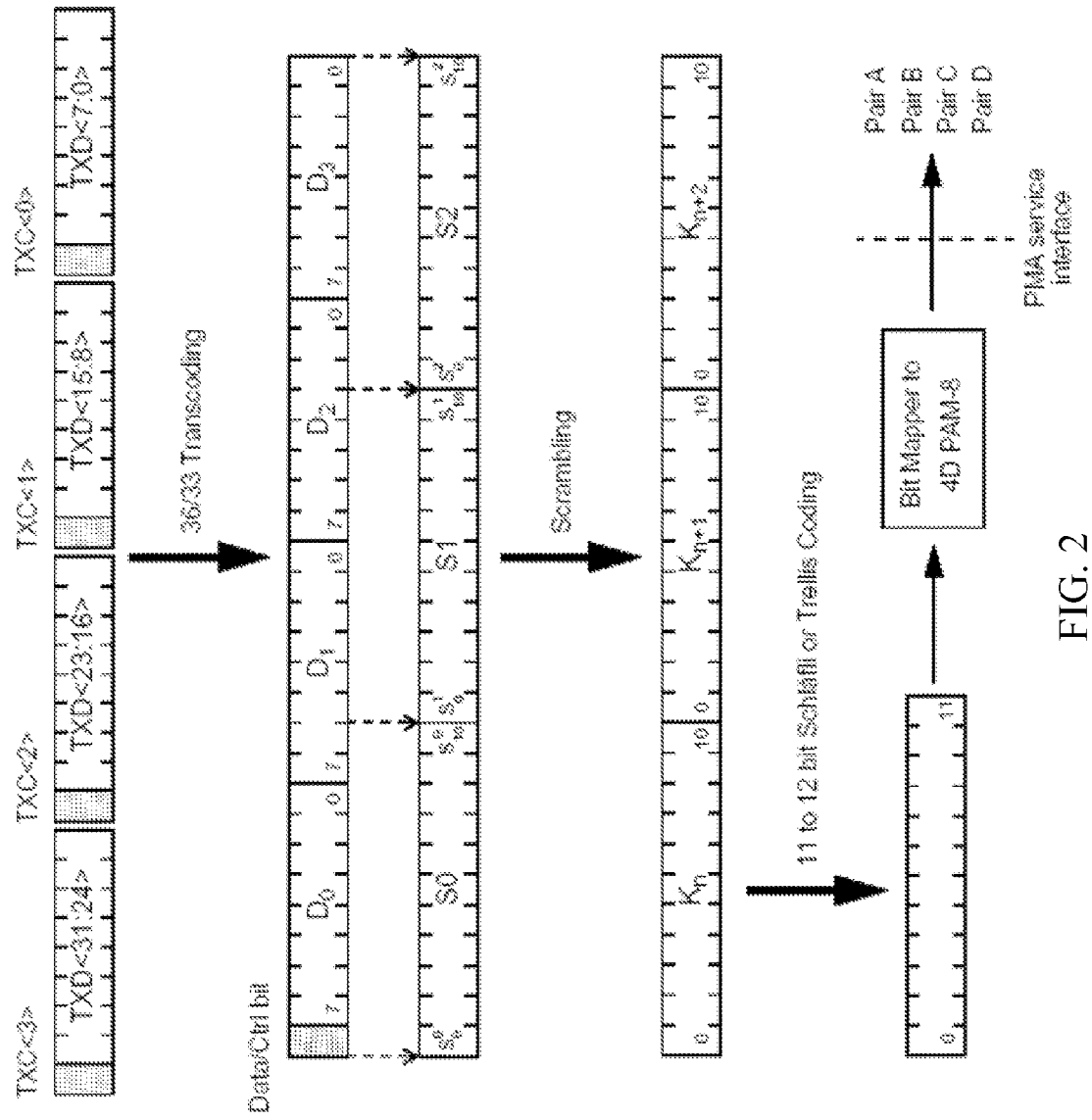
FIG. 2 illustrates a physical coding sublayer (PCS) scheme of operation in accordance with an embodiment.

Turning now to FIG. 2, representing the PCS Transmit scheme or operation, the PCS Transmit process continuously generates 33-bit (33b) blocks based upon the TXD <31:0> and TXC <3:0> signals on the XGMII. Each 33b block is divided into three 11-bit transmission characters. As illustrated, each 11-bit transmission character is scrambled and then Schlaefli lattice coded with 12 bits. The scrambler can be a so-called "side-stream scrambler" which does not move or multiply bit errors upon descrambling by the receiver. The 12 bits are in turn divided in four groups of three bits, each identifying a symbol in the 8-levels pulse amplitude modulation or PAM-8 symbol set {−7, −5, −3, −1, +1, +3, +5, +7}. The identified symbols form a 4-dimensional (4D) PAM-8 code group (An, Bn, Cn, Dn). FIG. 2 illustrates the mapping of four bytes on XGMII to a 33b block containing three characters.

In each symbol period, when communicating with the PMA, the PCS Transmit generates a code group (An, Bn, Cn, Dn) that is transferred to the PMA. The PMA transmits symbols An, Bn, Cn, Dn over wire-pairs A, B, C, and D, respectively. The integer, n, is a time index that is introduced to establish a temporal relationship between different symbol periods.

The resulting modulation rate is of 2.75 bit per symbol (11 bits on 4 symbols per character). In this example, 4D PAM-8 Schlaefli lattice coding is employed, the densest 4-dimensional lattice, using half points (e.g., 2048) of a 4096 point 4D PAM-8 constellation. This coding ensures that the minimum Euclidean squared distance between points of the Schlaefli lattice is 2 times the minimum Euclidean squared distance between two points of the complete 4D PAM-8 constellation.

Figure 3:
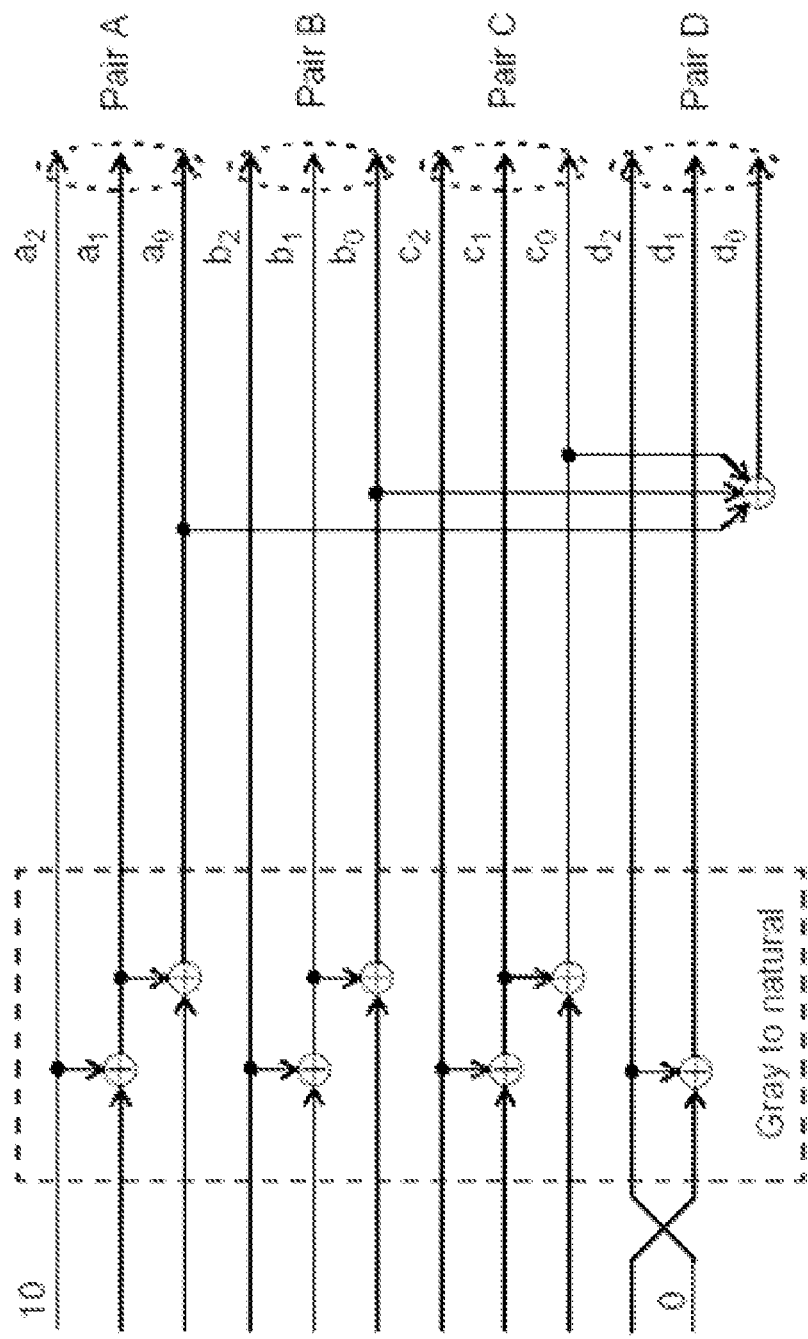
FIG. 3 illustrates a 4D PAM-8 Schlaefli lattice coding in accordance with an embodiment.

With reference now to FIG. 3, and turning to a discussion of Schlaefli lattice coding, each 33b block is divided into three 11-bit transmission characters, S0, S1, and S2 as shown in FIG. 2. Each 11-bit transmission character is scrambled and then Schlaefli lattice coded with 12 bits, as shown in FIG. 3.

The 11 bits of each scrambled transmission character are processed in the order shown, from bit 0 to bit 10. Bit 0 of each transmission character is mapped to bit d2, to ensure that bit 0 of transmission character S0 (e.g., the Data/Ctrl bit) is mapped into the msb (most significant bit) of the PAM-8 symbol transmitted on pair D. Bit a2, b2, and c2 are respectively generated equal to bits 10, 7, and 4 of the transmission character. Bit a1, b1, and c1 are respectively generated by XORing bits a2 with bit 9 of the transmission character, bits b2 with bit 6 of the transmission character, and bit c2 with bit 3 of the transmission character. Bit a0, b0, and c0 are respectively generated by XORing bits a1 with bit 8 of the transmission character, bits b1 with bit 5 of the transmission character, and bit c1 with bit 2 of the transmission character. Bit d1 is generated by XORing bit d2 with bit 1 of the transmission character. Bit d0 is generated by XORing bits a0, b0, and c0.

Figure 4:
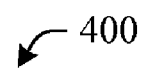
FIG. 4 illustrates a bits-to-symbols mapping in accordance with an embodiment.

Each group of three bits x2 x1 x0 (where x may be a, b, c, or d) identify a symbol in the PAM-8 symbol set {−7, −5, −3, −1, +1, +3, +5, +7}. The symbol mapping of bits to PAM-8 is shown in table 400 of FIG. 4. As an example of Schlaefli lattice coding, the 11-bits 10010100111b are coded to the 4 dimensional PAM-8 symbol (+7, +5, −5, +1).

Each symbol transmitted on a wire pair (lane) may have one of eight possible analog values, −7, −5, −3, −1, +1, +3, +5, or +7, and thus encodes 3 bits. A "small" physical error moves the decoded value by one step, e.g., from −5 to −7 or from −1 to +1. With the "Natural" bit encoding as set forth in table 400, a "small" physical error can cause up to a 3-bit error in the decoded value (e.g., −1→+1==>011b→100b). By performing a gray-to-natural encoding on transmission, and a corresponding natural-to-gray decoding on reception, Schlaefli lattice coding ensures that a "small" physical error on one symbol affects only one decoded bit.

Schlaefli lattice coding also uses a bit, bit d0 of FIG. 3, to further enhance decoding. This bit is transmitted as the XOR (parity) of all the bits in lanes A, B and C of the original transmission character. This has the effect of removing half of the points in the 4-dimensional lattice for the 4-dimensional symbol comprised of the 4 symbols on lanes A, B, C and D. This ensures that the minimum Euclidean squared distance between points of the Schlaefli lattice is 2 times the minimum Euclidean squared distance between points of the complete 4-dimensional PAM-8 constellation. This effect can improve the decoding process at the receiver.

FIG. 5 represents points in a 2-dimensional lattice space constructed in the same manner as the Schlaefli lattice is constructed in 4 dimensions. The valid code-points in the lattice are half of the possible code-points of the complete 2-dimensional constellation (e.g., (1, 1) is a valid lattice code-point, but (3, 1) is not). This makes the minimal squared Euclidean distance between code-points of the lattice 2 times the minimal squared Euclidean distance between code-points of the complete 2-dimensional constellation. Considering the lattice code-point (1, 1), a receiver will decode a received 2-dimensional signal as (1, 1) if it stays inside the square around the point (1, 1) in FIG. 5. The doubling of the minimal squared Euclidean distance between points of the lattice makes this "decoding square" four times bigger than it would be by using the complete 2-dimensional constellation. This means that a bigger perturbation is needed in order to incorrectly decode a code-point, and in this way the lattice coding improves the decoding process at the receiver, making it more robust against noise.

The square around a point of the 2-dimensional lattice becomes a polyhedron with 24 faces and 8 vertexes in the 4-dimensional Schlaefli lattice. Decoding a 4D PAM-8 symbol means to find the point of the Schlaefli lattice having the minimal Euclidean distance from the signals received on lanes A, B, C and D. An erroneous symbol is decoded when the received signals are contained in an erroneous polyhedron.

Returning to FIG. 3, effectively, this means that in accordance with Schlaefli lattice decoding, it is not possible to decode as if there was only one "small" error. Moving from one valid 12-bit code point (based on the values of a2a1a0, b2b1b0, c2c1c0, and d2d1d0) to another valid 12-bit code point requires two small errors, e.g., changing two of a0, b0, c, and d0. In most of the cases, this will appear as a 2-bit error in bits 0 through 10 of the original 11-bit gray-coded character, e.g., a 1-bit error in each of two lanes (among A, B, C, and D). In some cases, if one of the small errors occurs in lane D, and d0 is changed while d2 and d1 remain unchanged, the error in the original 11-bit gray-coded character will appear as only a 1-bit error in lane A, B, or C. This can be referred to as a "degenerate case". These Schlaefli coding and decoding properties are particularly important to understand when reviewing the categories of errors that are to be detected by the FC-EDC system 100.

Referring now to a discussion of Hamming codes, these codes are constructed using a parity-check matrix whose columns are all unique and nonzero. Traditionally, a Hamming code has minimum distance 3 thus, it can detect any errors of up to 2 bits. The following table 1 illustrates a parity-check matrix for the "perfect" Hamming code with 11 data bits, 4 check bits, and minimum distance 3 which, by design, can detect errors in up to 2 bits:

TABLE 1

| da | d9 | d8 | d7 | d6 | d5 | d4 | d3 | d2 | d1 | d0 | c0 | c1 | c2 | c3 |
|----|----|----|----|----|----|----|----|----|----|----|----|----|----|----|
| 0  | 0  | 0  | 0  | 1  | 1  | 1  | 1  | 1  | 1  | 1  | 1  | 0  | 0  | 0  |
| 0  | 1  | 1  | 1  | 0  | 0  | 0  | 1  | 1  | 1  | 1  | 0  | 1  | 0  | 0  |
| 1  | 0  | 1  | 1  | 0  | 1  | 1  | 0  | 0  | 1  | 1  | 0  | 0  | 1  | 0  |
| 1  | 1  | 0  | 1  | 1  | 0  | 1  | 0  | 1  | 0  | 1  | 0  | 0  | 0  | 1  |

Figure 6:
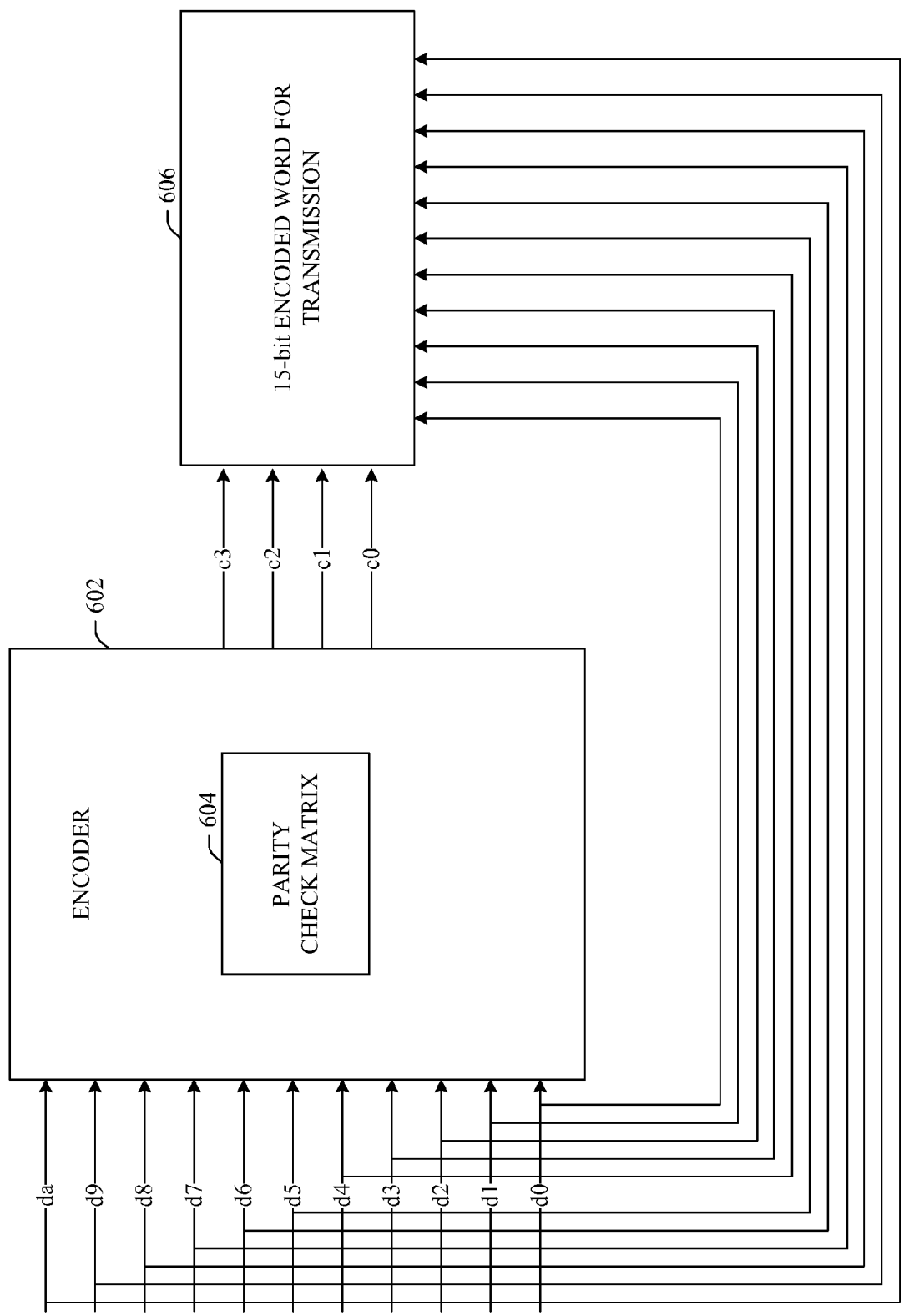
FIG. 6 illustrates an exemplary encoder that generates a 15-bit encoded word for transmission in accordance with an embodiment.

It is to be understood that the columns labeled d and c correspond to data and check bits, respectively. Each check bit is generated using a corresponding row of the parity-check matrix, the row where that parity bit's column has a 1. The check bit is selected so that the mod-2 sum (XOR) of all the bits that have a "1" in that row, including the check bit, is 0. In other words, the check bit is the complement of XOR of all the data bits that are selected by the "1" bits in its row. Thus, check bit c0 is the complement of the XOR of data bits d6 through d0. It is to be understood that, given such a parity-check matrix, one skilled in the art can design a digital logic circuit that computes the check bits c0-c3 for a set of data bits d0-da using a collection of XOR gates, or a programmable logic device or the like. It is also possible to compute the check bits using software running on a computer processor, although this is typically slower. An illustration of an encoder capable of computing the check bits (e.g., c0-c3) is shown in FIG. 6. More particularly, encoder 602 can employ matrix 604 to compute check bits in accordance with an embodiment.

Figure 7:
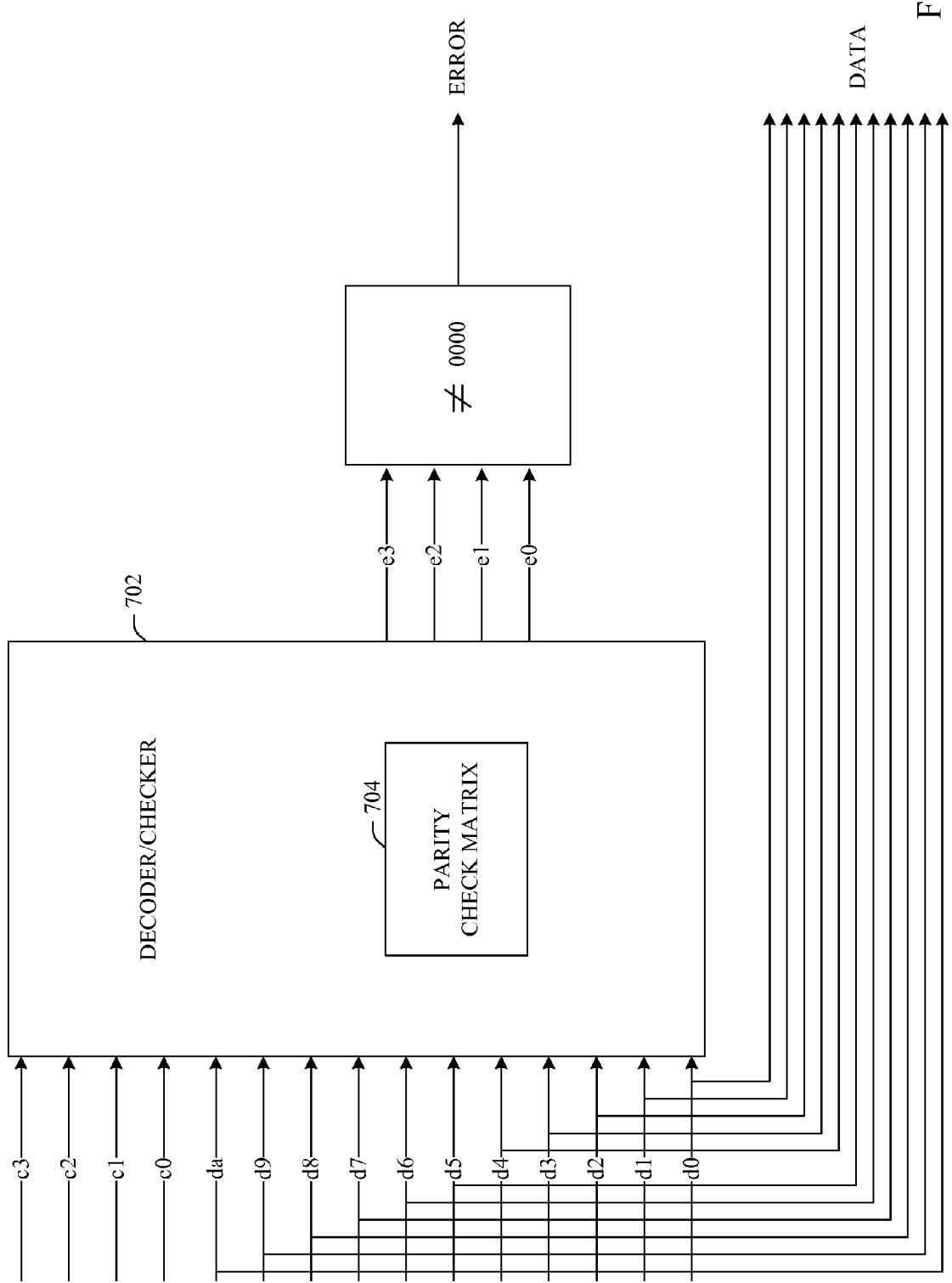
FIG. 7 illustrates an exemplary decoder that can establish 11 bits of data and 1 bit of error indication in accordance with an embodiment.

Similarly, an illustration of a decoder (or checker) 702 in accordance with an aspect of the specification is illustrated in FIG. 7. More particularly, the decoder of FIG. 7 can be used in accordance with a received Hamming code word. The decoder computes the parity of four different, partially overlapping subsets of bits in the received Hamming code word, each subset being defined by the 1 bits in a corresponding row of the parity-check matrix 704. This computation yields a 4-bit value called the "syndrome," where a bit is 0 if the computed parity is even, and 1 if it is odd. If all four bits of the syndrome are zero, then the received word is assumed to be correct. If any bit of the syndrome is nonzero, then an error has occurred. The individual syndrome bits can be computed in hardware using XOR gates. An OR gate can be used to determine whether any syndrome bit is nonzero, thereby creating an "Error" signal. It is also possible to compute the syndrome and check for errors using software running on a computer processor, although this is typically slower. In an EDC with more check bits, there are more bits in the syndrome, always one syndrome bit per row of the parity-check matrix; and as shown in FIG. 7, if any syndrome bit is nonzero, an error has occurred.

Referring again to the Hamming code described above, it is to be understood that the code is referred to as "perfect" because it has the maximum number of data bits that that can be protected with just 4 check bits and still have minimum distance 3. Moreover, it is to be understood that many different permutations are possible for the data columns in the parity-check matrix above (e.g., table 1), while maintaining a minimum distance 3. The only requirement is that each column must be nonzero and unique. With 4 check bits, there are 4 rows, hence 15 nonzero columns, where the columns with a single 1 correspond to check bits. This is why there are 11 (15 minus 4) data bits in the "perfect" Hamming code with 4 check bits, and up to 26 data bits with 5 check bits, 57 with 6 check bits, etc.

The minimum distance of a Hamming code can be increased to 4 (triple-error-detecting) by adding another "overall" parity bit which checks all of the other bits. Adding this additional parity bit adds another row and column to the parity-check matrix as shown in table 2 below:

TABLE 2

| da | d9 | d8 | d7 | d6 | d5 | d4 | d3 | d2 | d1 | d0 | c0 | c1 | c2 | c3 | c4 |
|----|----|----|----|----|----|----|----|----|----|----|----|----|----|----|----|
| 0  | 0  | 0  | 0  | 1  | 1  | 1  | 1  | 1  | 1  | 1  | 1  | 0  | 0  | 0  | 0  |
| 0  | 1  | 1  | 1  | 0  | 0  | 0  | 1  | 1  | 1  | 1  | 0  | 1  | 0  | 0  | 0  |
| 1  | 0  | 1  | 1  | 0  | 1  | 1  | 0  | 0  | 1  | 1  | 0  | 0  | 1  | 0  | 0  |
| 1  | 1  | 0  | 1  | 1  | 0  | 1  | 0  | 1  | 0  | 1  | 0  | 0  | 0  | 1  | 0  |
| 1  | 1  | 1  | 1  | 1  | 1  | 1  | 1  | 1  | 1  | 1  | 1  | 1  | 1  | 1  | 1  |

Again, it is to be understood that many different permutations are possible for the data columns in the parity-check matrix of table 2 while maintaining a minimum distance 4. It is also possible to derive equally valid parity-check matrices by making linear combinations (XORs) of rows. For example, by XORing the first four rows above with the last row, it is possible to make a new version of the last row where the "overall" parity bit c4 is a function of only the data bits, not the other check bits.

Figure 8:
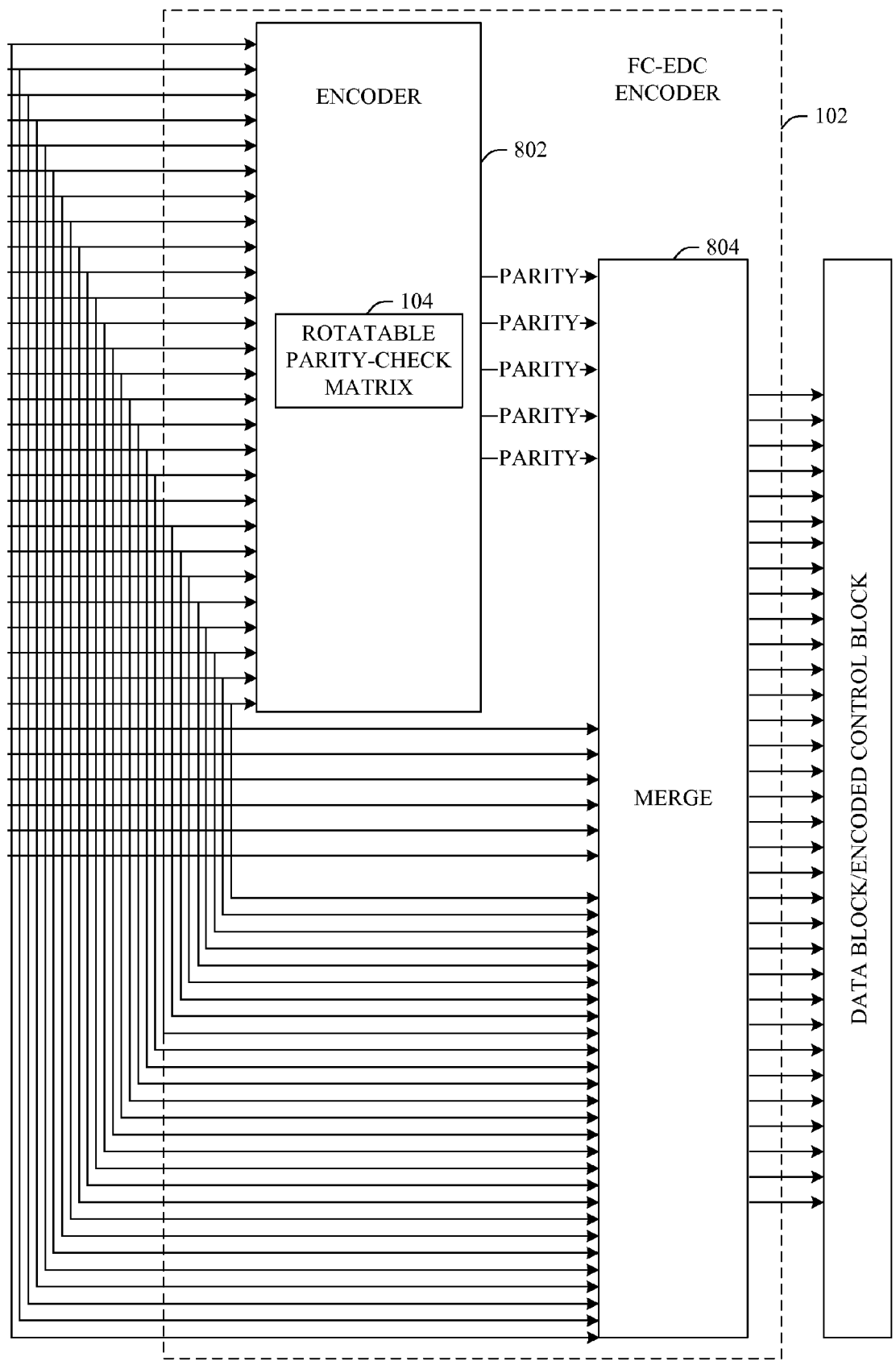
FIG. 8 illustrates an encoder that can generate check bits for a control block using the subject EDC in accordance with an embodiment.

Similarly, in accordance with the FC-EDC system 100, FIG. 8 illustrates an FC-EDC encoder 102 in accordance with an aspect of the specification. As shown, this encoder 102 can generate check bits for a control block input using the subject EDC. In its simplest form, FIG. 8 illustrates a single block 802 with 27 inputs and 5 outputs. It is to be understood that the 27 inputs are representative of data while the 5 outputs are representative of the check bits. Moreover, the data bits and the check bits are joined on the right hand side (e.g., via "merge" block 804), along with the 1/0 bit that selects control versus data blocks, to form a 33-bit block to be transmitted.

Figure 9:
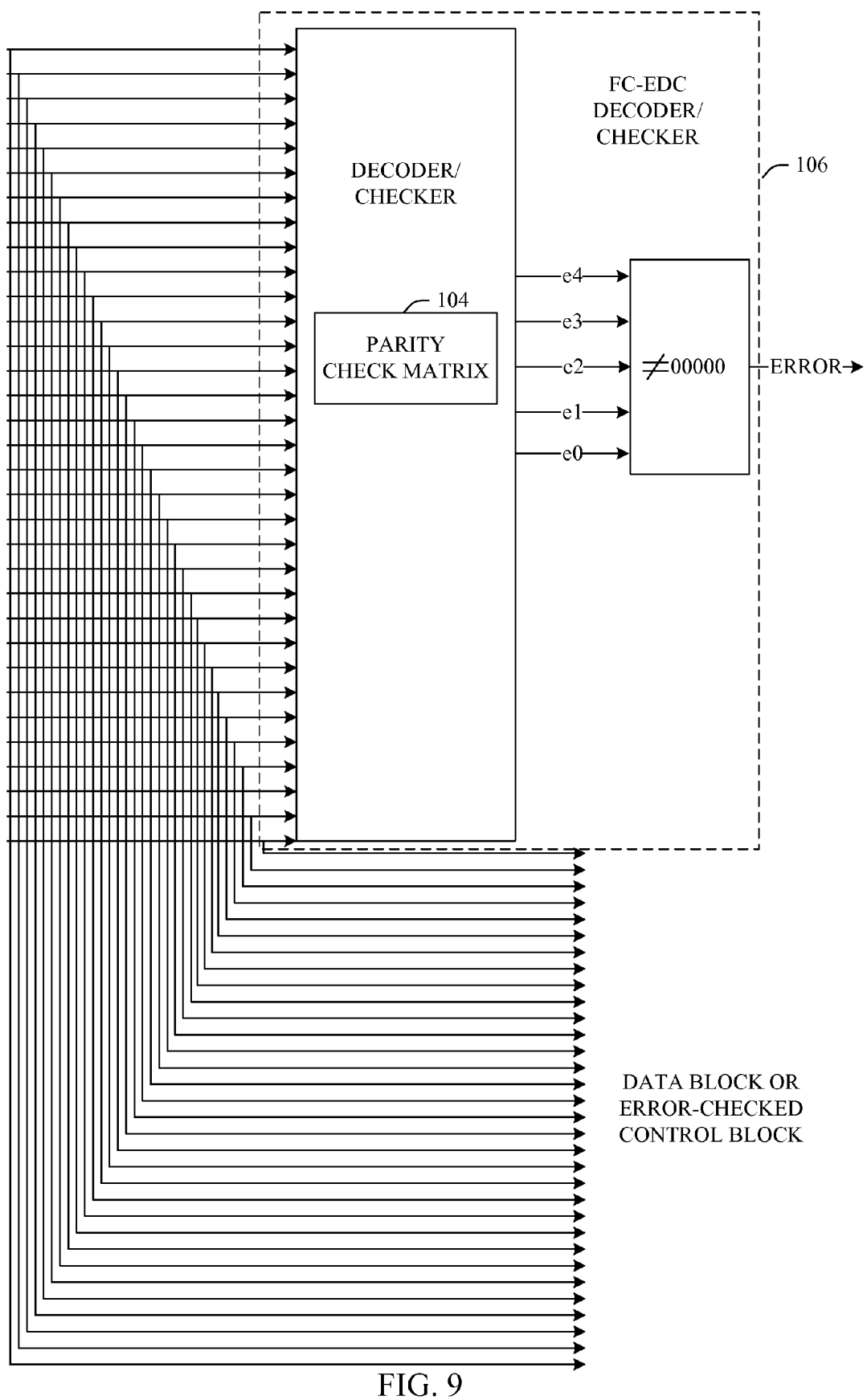
FIG. 9 illustrates a block diagram of a decoder that detects errors in a control block that has been transmitted in accordance with the EDC of an embodiment.

FIG. 9 illustrates an exemplary decoder/checker 106 in accordance with the subject EDC. In operation, this decoder 106 can detect errors in a control block (e.g., control block from FIG. 8) that has been transmitted using the subject EDC. As shown in FIG. 9, the output of this decoding operation is a 33-bit data block or error-checked control block in addition with one bit of ERROR.

Following is a discussion of mapping Hamming code onto FC-BaseT transmission in accordance with an embodiment. In the FC-BaseT transmission scheme, a single character has 11 bits transmitted over the four pairs. Thus, a distance-4 Hamming code with 11 data bits and 5 check bits could detect up to three errors in a single character.

In the FC-BaseT scenario, three 11-bit characters (e.g., S0, S1, S2) per block are transmitted. It is particularly important to check all three characters. It is to be understood that, if physical errors affect the characters independently, they can use the same check bits to detect errors in all three characters. That is, if the above parity-check matrix (e.g., table 2) is employed to detect errors in bits d_0 to d_10 of the first character (S0), the same parity-check matrix can be employed to detect errors in bits d_0 to d_10 of the second and third characters (S1 and S2 respectively).

However, the specification discloses employment of the three independently-generated sets of 5 check bits for the three characters, and bitwise XORing them to yield just a single set of 5 check bits for the 33-bit transmission. By doing so, it is still possible to detect any 3-bit error that is isolated to a single 11-bit character.

Because the 5 check bits are not sent separately, but instead are carved out of the available 33 bits, this operation is somewhat more difficult than previously stated. However, it is to be understood that, in an alternative embodiment, 5 additional bits can be used.

Figure 10:
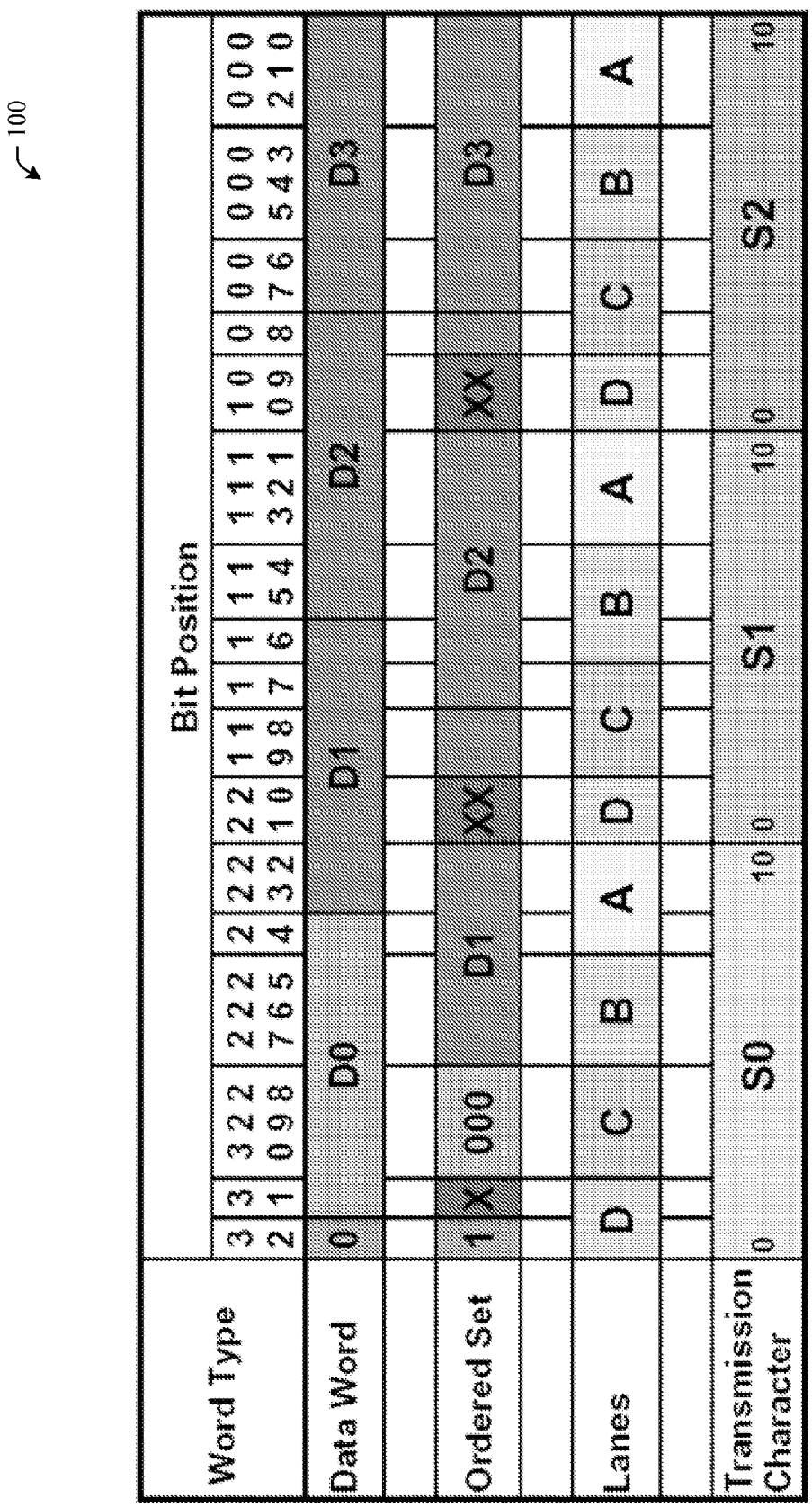
FIG. 10 illustrates a transcoding or mapping of Fibre Channel words in accordance with an embodiment.

Referring to FIG. 10, one preferred mapping of data bits and check bits to the individual characters, lanes, and symbols in the FC-BaseT transmission is shown. As shown in FIG. 10, the "X"s mark the positions of the 5 check bits. Mapping the 5 check bits and the control/data bit exclusively to lane D enhances the properties of the FC-EDC compared to other possible mappings, although exploring the properties of all possible mappings is a computationally intractable problem.

The preceding paragraphs refer to physical errors that affect only a single character. Turning now to a discussion of errors that affect multiple characters, it is of course possible that physical disturbances last longer and span across multiple character times. In accordance therewith, the FC-EDC system 100 of the subject disclosure is capable of detecting errors that affect multiple characters.

Because the same parity-check matrix is used in all characters, it is possible for the code construction suggested above to fail for errors affecting two symbols in the same lane. For example, bit d_10 in all three characters transmitted on lane/pair A is protected by parity-check matrix column da (00111). If a 1-bit error occurs on bit d_10 of two of those three characters, the parity errors will cancel (00111 XOR 00111 yields a syndrome of 00000), and the error will not be detected.

Figure 11:
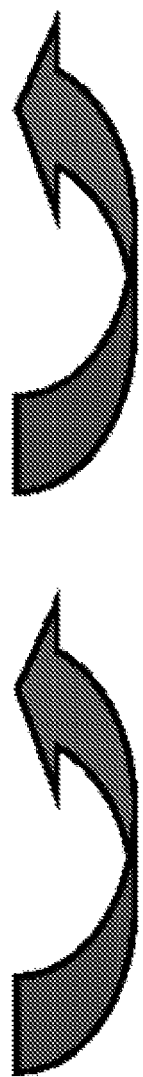
FIG. 11 illustrates a "rotation" of the parity-check matrix in accordance with an embodiment.

The subject technology can address this problem by rotating the parity-check matrix for successive characters so that different columns are used to protect all of the bits that are transmitted in the same lane. This rotation technique is illustrated in FIG. 11.

Continuing with the example above, following rotation, the parity-check matrix for the second character could be as shown in table 3 below:

Here, the data-bit columns of the parity-check matrix have been rotated left by three bit-positions. This ensures that when the matrix is applied to the second transmission character, all three columns in a given lane are unique compared to the columns used in the same lane of the first transmission character. For the third transmission character, the parity-check matrix is further rotated by three bit-positions. Thus, the resulting code can detect not only up-to-3-bit errors in a single transmission character, but also up-to-3-bit errors in a single lane. FIG. 11 shows a complete 33-bit-wide parity-check matrix that is constructed using the rotation technique. This matrix also includes columns for the control/data bit and the check bits, in accordance with the type of mapping shown in FIG. 10.

Since the FC-BaseT PCS uses Schlaefli coding, further enhancements can be realized. For instance, since Schlaefli decoding avoids most odd-bit errors, it is possible to perhaps weaken the error-detecting properties of the FC-EDC in return for improved detection of greater-than-3-bit errors.

It is to be appreciated that the most likely physical errors are the ones that have the smallest squared-distance in the analog domain. First consider the errors that are isolated to a single character:

1) Most 1-bit and 3-bit errors on lanes A, B, C and D are avoided by Schlaefli decoding. However, a 1-bit error can be created from a 2-bit error if one of the erroneous bits is on lane D and is thrown away after natural-to-gray conversion (this is called a "degenerate case"). Still, such 1-bit errors are detected by FC-EDC (minimum distance at least 2—no zero columns in the parity-check matrix).

2) All 2-bit errors in lanes A, B, C and D are detected by FC-EDC (minimum distance at least 3—unique columns).

3) All 1-1-1-1-bit errors (1 bit in each of four lanes) in lanes A, B, C and D can be detected by FC-EDC "by construction" (see below). This includes 1-1-1-1 bit errors that are converted to 1-1-1-bit errors on lanes A, B, and C when the errored bit in lane D is thrown away after natural-to-gray conversion.

4) Similarly, all 2-1-1-bit errors in lanes A, B and C and D (2 bits in one lane and 1 bit in each of two other lanes) can be detected by FC-EDC "by construction" (also see below).

Next, consider errors that are isolated to a single lane:

1) All 1-bit errors in lanes A, B and C are avoided by Schlaefli and would be detected by FC-EDC anyway.

2) All 1-bit errors in lane D are either avoided by Schlaefli (if the bit is thrown away after natural-to-gray conversion, again a "degenerate case") or detected by FC-EDC (minimum distance at least 2—no zero columns).

3) All 2-bit errors in lanes A, B, C and D are either detected by FC-EDC (since distance-3—unique columns), or are con-

TABLE 3

| da | d9 | d8 | d7 | d6 | d5 | d4 | d3 | d2 | d1 | d0 | c0 | c1 | c2 | c3 | c4 |
|---|---|---|---|---|---|---|---|---|---|---|---|---|---|---|---|
| 0 | 1 | 1 | 1 | 1 | 1 | 1 | 1 | 0 | 0 | 0 | 1 | 0 | 0 | 0 | 0 |
| 1 | 0 | 0 | 0 | 1 | 1 | 1 | 1 | 0 | 1 | 1 | 0 | 1 | 0 | 0 | 0 |
| 1 | 0 | 1 | 1 | 0 | 0 | 1 | 1 | 1 | 0 | 1 | 0 | 0 | 1 | 0 | 0 |
| 1 | 1 | 0 | 1 | 0 | 1 | 0 | 1 | 1 | 1 | 0 | 0 | 0 | 0 | 1 | 0 |
| 1 | 1 | 1 | 1 | 1 | 1 | 1 | 1 | 1 | 1 | 1 | 1 | 1 | 1 | 1 | 1 | verted to 1-bit errors (when an erroneous transmission on lane D is thrown away after natural-to-gray conversion, a "degenerate case").

4) All 1-1-1-bit errors in lane D that have 1 or more errored bits thrown away after natural-to-gray conversion have a net of two or fewer bit errors, which are detected by FC-EDC (nonzero, unique columns).

5) All other 1-1-1-bit errors in lane D (on transmission bits d_1, d_2) are detected by FC-EDC "by construction".

6) All 1-1-1-bit errors in lanes A, B and C are detected by FC-EDC "by construction."

Figure 12:
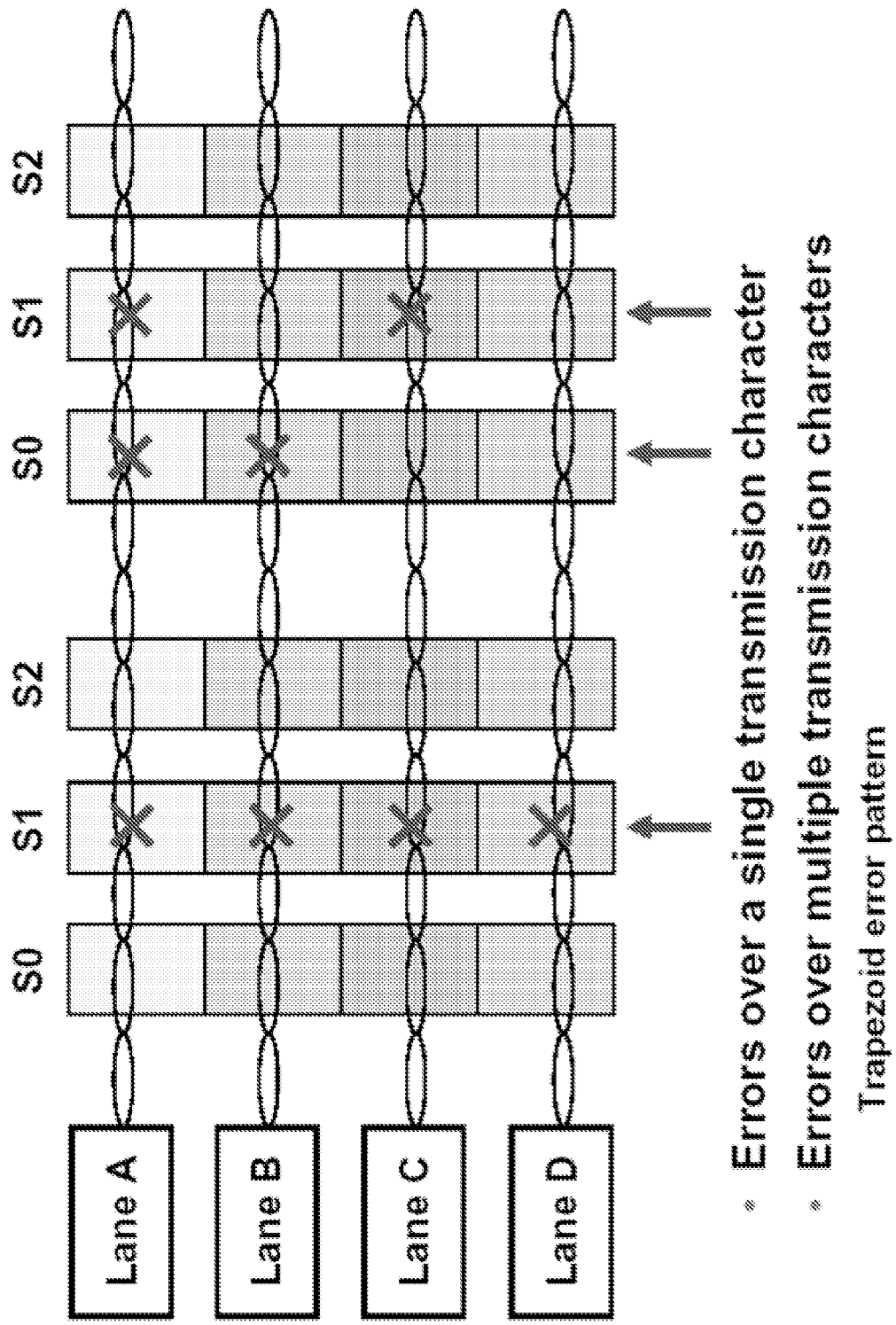
FIG. 12 illustrates exemplary 4-bit and trapezoid errors in accordance with an embodiment.

7) Another error pattern of interest is four 1-bit errors in a "trapezoid" pattern—two 1-bit errors in the same lane of two successive characters, and two 1-bit errors in each of two other lanes of the same characters. Although this error can be induced by Schlaefli decoding when there is a physical disturbance in two successive characters of one lane, it is not always detected by FC-EDC. However, it is desirable at least to minimize the number of undetectable trapezoid-error patterns when selecting a parity-check matrix. To assist in an understanding, FIG. 12 is included and illustrates an exemplary trapezoid error in accordance with an aspect of the technology.

Figure 13:
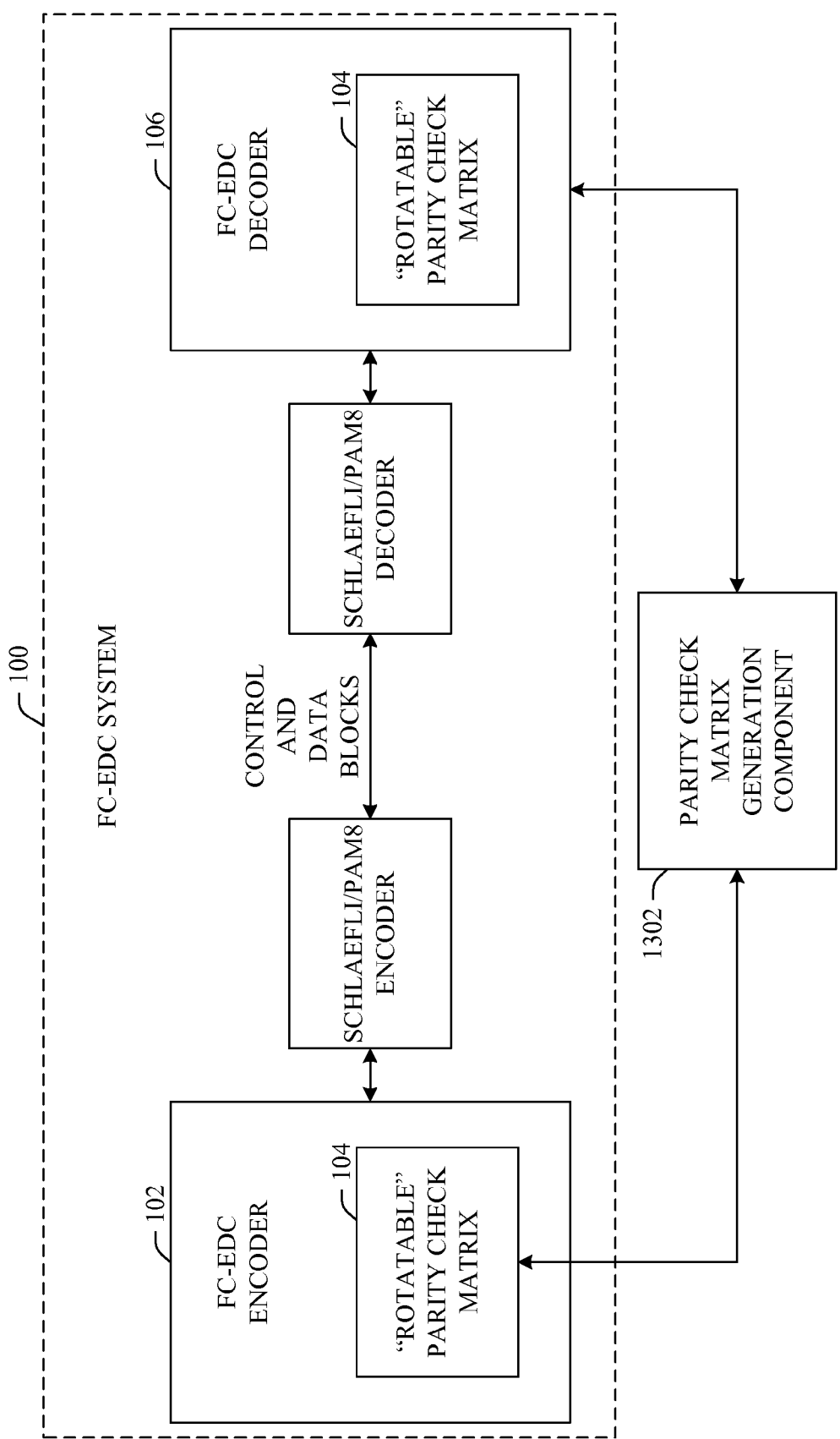
FIG. 13 illustrates a system that employs a parity-check matrix generation component (or program) that identifies matrices having "rotational" properties in accordance with an embodiment.

Referring now to FIG. 13, as stated above, detecting errors via FC-EDC "by construction" refers to a use of a program or parity-check matrix generation component 1302 to search the set of possible parity-check matrices having the rotation property. In operation, this parity-check matrix generation component 1302 can search matrices with the rotation property until a matrix (or set of matrices) is located having the desired error-detection properties. For a given set of 11 parity-check matrix data columns for an extended Hamming code with 11 data bits and 5 check bits, and for a given mapping of these columns to the characters, lanes, and symbols of an FC-BaseT transmission as in FIG. 6, there can be 11!/2, or 19,958,400 possible 33-bit-wide parity-check matrices having the rotation property.

Turning now to a discussion of the frequency of error patterns, it will be understood that certain error patterns can occur more often than others. To facilitate a discussion with respect to the frequency of error patterns, consider the following table 4, which shows the gray-to-natural mapping for three bits of a symbol:

TABLE 4

| Gray | | | Natural | | |
|---|---|---|---|---|---|
| S2 | S1 | S0 | A2 | A1 | A0 |
| 0 | 0 | 0 | 0 | 0 | 0 |
| 0 | 0 | 1 | 0 | 0 | 1 |
| 0 | 1 | 1 | 0 | 1 | 0 |
| 0 | 1 | 0 | 0 | 1 | 1 |
| 1 | 1 | 0 | 1 | 0 | 0 |
| 1 | 1 | 1 | 1 | 0 | 1 |
| 1 | 0 | 1 | 1 | 1 | 0 |
| 1 | 0 | 0 | 1 | 1 | 1 |

A "small" physical error has the effect of moving a symbol value in one row of the table to the row immediately above or below it. Considering the structure of this table, there is only one "small" physical error that can cause gray bit S2 to be decoded incorrectly—a move between the fourth and fifth rows. There are two "small" physical errors that can cause gray bit S1 to be decoded incorrectly—between the second and third or between the sixth and seventh rows. As well, there are four "small" physical errors that can cause gray bit S0 to be decoded incorrectly.

The frequency of these error patterns can be considered when evaluating possible parity-check matrices. For example, consider a particular error pattern, such as the 4-bit "trapezoid" error patterns mentioned previously. It is not possible to construct a code, using only five check bits, that detects all possible "trapezoid" error patterns (e.g., some will be undetected).

When evaluating the suitability of different parity-check matrices, the columns can be arranged so as to minimize the number of undetected error patterns. For example, suppose there is a set of four parity-check-matrix columns that correspond to an undetectable 4-bit trapezoid-pattern error. If all four of these columns correspond to gray bit S0 in their respective transmission symbol, then there will be four ways that each of these symbols can be corrupted by a "small" physical error, and a total of 4*4*4*4=256 different ways to get an undetected error for this trapezoid pattern.

On the other hand, if these same four parity-check-matrix columns correspond to gray bit S2 in their respective transmission symbol, then there will be only one way that each of these symbols can be corrupted by a "small" physical error, and a total of 1*1*1*1 or just one way to get an undetected error for this trapezoid pattern.

Thus, when the parity-check matrix generation component 1302 (or program) finds an undetectable error pattern, it does not simply count it as one undetected error. Rather, it counts the number of ways in which that error pattern could be seen, based on the "error weights" of the symbol bits that are involved in that error pattern. The weights are 4, 2, and 1 for symbol bits S0, S1, and S2, respectively. The number of ways that the error can occur is computed as the product of the weights for all of the involved positions. The parity-check matrix generation component 1302 picks a parity-check matrix that minimizes the sum of these products for all of the undetected error patterns.

The program 1302 checks all permutations of parity-check matrices that have the "rotation" property described earlier, and determines whether or not they detect all errors matching the stated criteria. There are 11!/2 or 19,958,400 parity-check matrices to analyze, calculated as the value of the binomial coefficient "11 choose 9"—9 column values to select from 11 possible and allocate to the 9 parity-check matrix column positions corresponding to lanes A, B and C in the first character; the rest of the values are determined by "rotation." The "rotation" operation avoids a much worse combinatorial explosion. Note that the columns corresponding to lane D are set, without loss of generality, as 5 check-bit columns, plus one column of 00000 corresponding to the control/data bit, which is not checked. Not checking the control/data bit with FC-EDC makes sense because there are just two possibilities, and neither one would benefit from such a check: (1) The bit is transmitted as a 0, indicating a data word, but received as a 1; in this case the received data will be interpreted as a control word, with a 31-in-32 chance that the FC-EDC indicates an error, and (2) The bit is transmitted as a 1, indicating a control word, but received as a 0; in this case, the control word will be ignored and will instead be considered to be part if the data stream where the error may be detected by the data stream's CRC error detecting code, which is not a subject of the present disclosure.

Using the "standard" column values for a distance-4 extended Hamming code, no parity-check matrix has all of the desired error-detecting properties. However, small additional "tweaks" could be made to the starting column values.

In particular, the overall-parity bit (e.g., last row of the 15-bit wide extended-Hamming-code parity-check matrix) is dropped from certain of the columns, including some check-bit columns and some data-bit columns. On one hand, doing this invalidates the code's ability to detect all 3-bit errors, but this is acceptable in many cases because Schlaefli decoding avoids most 3-bit errors. For example, the code shown later will not detect a 3-bit error in character S0, lane C, but this error is avoided by Schlaefli decoding. In return, doing this creates a greater set of opportunities to arrive at a parity-check matrix with all of the other desired error-detecting properties.

One reason that this modification works can be best understood by considering 4-bit errors. If all of the bits in the last row of the parity-check matrix are 1, then no 4-bit errors will ever be detected by that row of the parity-check matrix, since the XOR of four 1s is 0, resulting in a 0 in that position of the syndrome. When some of the bits in that row are 0, however, then some 4-bit error patterns will have one of their 1s in a corresponding column, so that only three 1s will be XORed to yield a 1 in the syndrome and hence a detectable error.

In accordance with the operation of the subject program 1302, a procedure can be used to select alternative starting column values, with or without the last-row bit set to 1. The program 1302 can be used to verify if the selection improved the results. It is to be appreciated that a manual procedure can be used to select alternative starting column values to be applied to the program 1302 and can yield adequate results in this case; for example, fewer than a dozen different combinations of starting column values can be tested to arrive at an adequate result. Alternatively, the program 1302 can be enhanced to automatically select alternative starting column values.

Based upon the error-detection criteria stated earlier, the program 1302 can be employed to locate 2 parity-check matrices (out of a possible 19,958,400) that meet the stated error-detection criteria, while also minimizing the number of trapezoid-pattern errors; the program output for one of these is shown below in table 5:

4011 errors, w=26: 12, 24, 20, 23, 27, 15, 6, 10, 30, 28, 18
19958400

Best 11-bit parity-check matrix data columns (col[10] . . . col[0]):

TABLE 5

| 0 | 1 | 1 | 1 | 1 | 0 | 0 | 0 | 1 | 1 | 1 |
|---|---|---|---|---|---|---|---|---|---|---|
| 1 | 1 | 0 | 0 | 1 | 1 | 0 | 1 | 1 | 1 | 0 |
| 1 | 0 | 1 | 1 | 0 | 1 | 1 | 0 | 1 | 1 | 0 |
| 0 | 0 | 0 | 1 | 1 | 1 | 1 | 1 | 1 | 0 | 1 |
| 0 | 0 | 0 | 1 | 1 | 1 | 0 | 0 | 0 | 0 | 0 |

A 33-bit parity-check matrix (p[32] . . . p[0]) is shown in table 6 below:

0, 16, 12, 24, 20, 23, 27, 15, 6, 10, 30, 8, 4, 23, 27, 15, 6, 10, 30, 12, 24, 20, 2, 1, 6, 10, 30, 12, 24, 20, 23, 27, 15

The 11-column matrix above (table 5) has the unrotated "data" columns, with columns 0 and 1 being unused and columns 2 through 10 being used to populate the 33-column matrix (table 6) that checks the actual 33-bit transmission. The columns p[32] . . . p[0] have the same numbering as the bits in FIG. 10 described supra.

The "4011 errors" mentioned in the first line of output are undetected trapezoid-pattern errors as discussed supra. The other pattern types discussed previously, e.g., types 1-4 within a character and types 1-6 in a single lane, can be detected. The notation "w=26" in the first line of output indicates that columns 2 through 10 of the 11-bit parity-check matrix have 26 1s in them, which can be a measure of the cost of implementing the corresponding circuit, that is, the number of XOR-gate inputs needed. Among parity-check matrices with equal error-detecting capabilities, it is particularly helpful to select the least costly.

The comma-separated lists of 11 and 33 decimal numbers are just another representation of the 11-bit and 33-bit parity-check matrices—the decimal values of the matrix columns.

Figure 14:
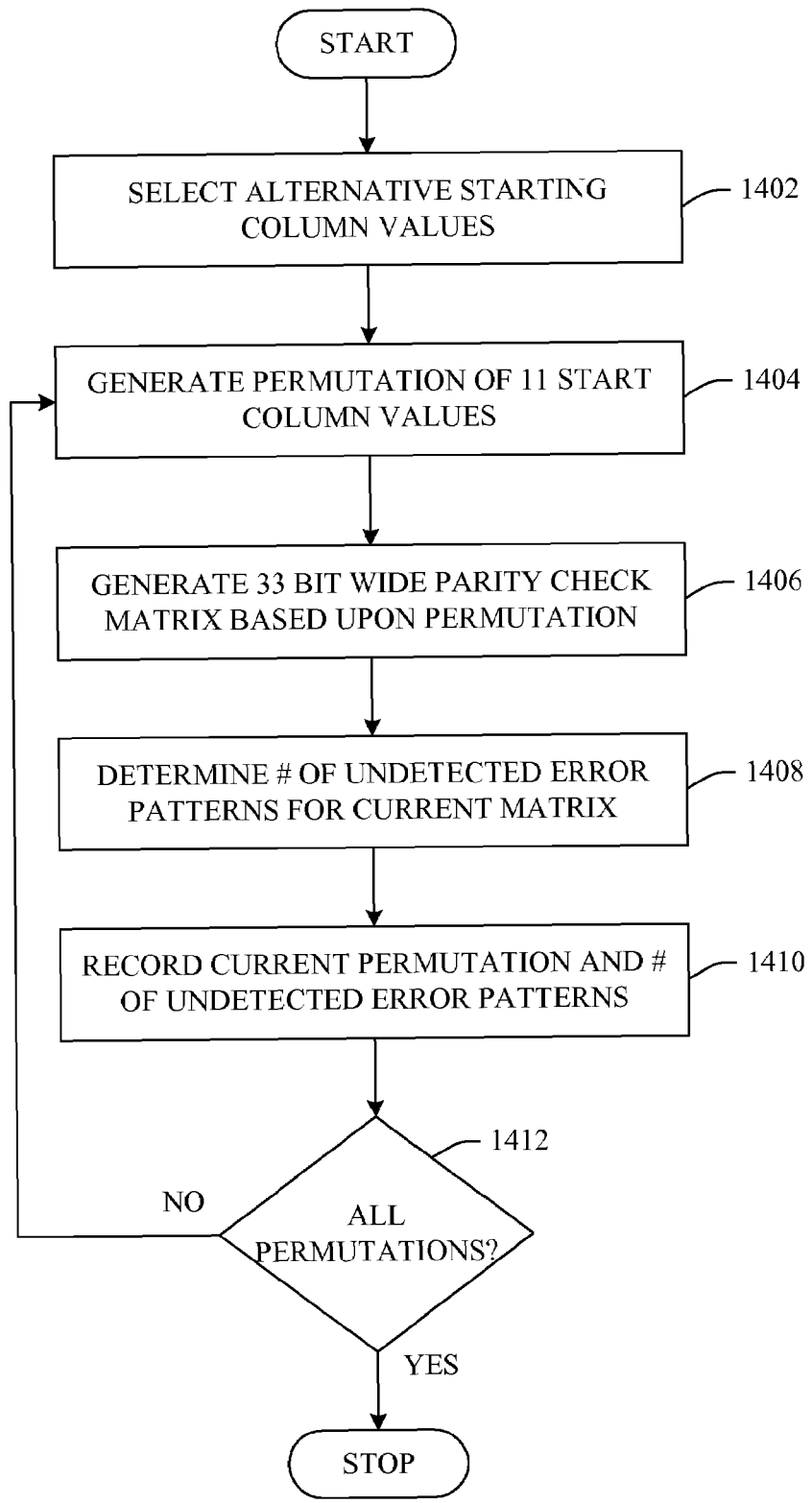
FIG. 14 illustrates an exemplary flow chart of procedures that facilitate generation of a parity-check matrix in accordance with an embodiment.

FIG. 14 illustrates a methodology of establishing a parity-check matrix in accordance with an aspect of the subject specification. While, for purposes of simplicity of explanation, the one or more methodologies shown herein, e.g., in the form of a flow chart, are shown and described as a series of acts, it is to be understood and appreciated that the subject disclosure is not limited by the order of acts, as some acts may, in accordance with the technology, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the technology.

In accordance with the process flow, in one aspect, at 1402 alternative starting column values can be selected. Next, at 1404, a permutation of 11 starting column values can be generated. Based upon the current permutation, a 33-bit-wide parity matrix can be established at 1406.

At 1408, the program can next determine the number of undetected error patterns for the current parity-check matrix. If the current permutation and associated number of undetected error patterns is the best so far, at 1410, the information can be recorded. As shown by the decision block at 1412, a determination can be made if all permutations have been generated. If not, the process returns to 1404 to generate additional permutations. On the other hand, if all permutations have been generated at 1412, the value of the best permutation and corresponding number of undetected error patterns and 33-bit-wide parity-check matrix can be rendered (e.g., displayed).

It is to be understood and appreciated that the computer-implemented programs and software (e.g., matrix generating program) can be implemented within a standard computer architecture. While some aspects of the disclosure have been described above in the general context of computer-execut-

TABLE 6

| 0 | 1 | 0 | 1 | 1 | 1 | 1 | 0 | 0 | 0 | 1 | 0 | 0 | 1 | 1 | 0 | 0 | 0 | 1 | 0 | 1 | 1 | 0 | 0 | 0 | 0 | 1 | 0 | 1 | 1 | 1 | 1 | 0 |
| 0 | 0 | 1 | 1 | 0 | 0 | 1 | 1 | 0 | 1 | 1 | 1 | 0 | 0 | 1 | 1 | 0 | 1 | 1 | 1 | 0 | 0 | 0 | 0 | 1 | 1 | 1 | 1 | 0 | 0 | 1 | 1 |   |
| 0 | 0 | 1 | 0 | 1 | 1 | 0 | 1 | 1 | 0 | 1 | 0 | 1 | 1 | 0 | 1 | 1 | 0 | 1 | 1 | 0 | 1 | 0 | 0 | 1 | 0 | 1 | 1 | 0 | 1 | 1 | 0 | 1 |
| 0 | 0 | 0 | 0 | 0 | 1 | 1 | 1 | 1 | 1 | 1 | 0 | 0 | 1 | 1 | 1 | 1 | 1 | 0 | 0 | 0 | 0 | 1 | 0 | 1 | 1 | 1 | 0 | 0 | 0 | 1 | 1 | 1 |
| 0 | 0 | 0 | 0 | 0 | 1 | 1 | 1 | 0 | 0 | 0 | 0 | 0 | 1 | 1 | 1 | 0 | 0 | 0 | 0 | 0 | 0 | 0 | 1 | 0 | 0 | 0 | 0 | 0 | 0 | 1 | 1 | 1 | able instructions that may run on one or more computers, those skilled in the art will recognize that the technology also can be implemented in combination with other program modules and/or as a combination of hardware and software.

Generally, program modules include routines, programs, components, data structures, etc., that perform particular tasks or implement particular abstract data types. Moreover, those skilled in the art will appreciate that the inventive methods can be practiced with other computer system configurations, including single-processor or multiprocessor computer systems, minicomputers, mainframe computers, as well as personal computers, hand-held computing devices, microprocessor-based or programmable consumer electronics, and the like, each of which can be operatively coupled to one or more associated devices.

The illustrated aspects of the disclosure may also be practiced in distributed computing environments where certain tasks are performed by remote processing devices that are linked through a communications network. In a distributed computing environment, program modules can be located in both local and remote memory storage devices.

Figure 15:
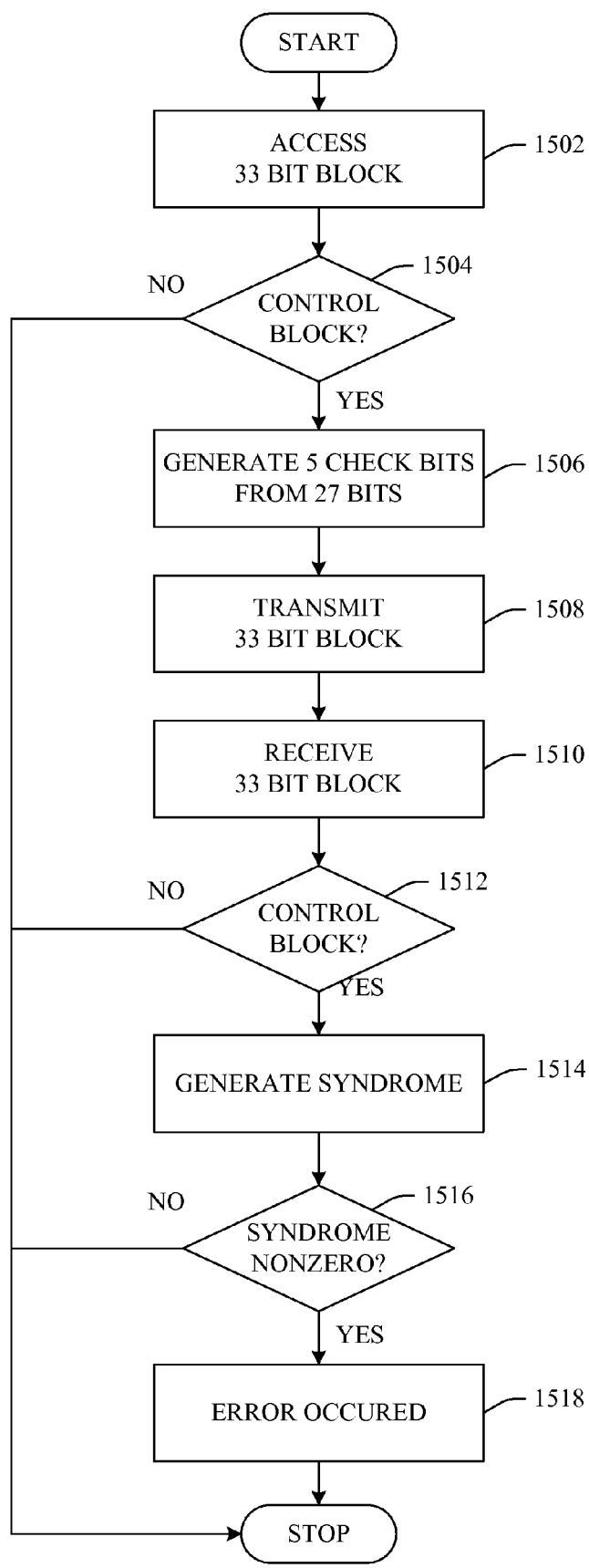
FIG. 15 illustrates an exemplary flow chart of procedures that facilitate transmitting and receiving control blocks and detecting errors in accordance with an embodiment.

FIG. 15 illustrates a methodology for transmitting (e.g., 1502-1508) and receiving control blocks and detecting errors (e.g., 1510-1518) in accordance with an aspect of the specification. At 1502, a 33-bit block is accessed. At 1504, a determination is made if the block is a control block. If the block is determined to be a control block, check bits are generated from the inputted data bits. More particularly, the 27 inputted data bits can be employed to generate 5 check bits in accordance with a selected parity-check matrix. In one aspect, this check bit generation can be accomplished using the encoder of FIG. 8.

The 33 bit block can be transmitted and received at another location (e.g., 1508, 1510). At 1512, a determination can be made if the received block is a control block. If determined to be a control block at 1512, a 5-bit syndrome can be generated at 1514. More specifically, a decoder (e.g., FIG. 9) can be employed to generate the 5-bit error syndrome for the received control block. Finally, a determination can be made at 1516 if the syndrome has a non-zero value. If the syndrome is nonzero, a declaration that an error occurred can be made at 1518.

What has been described above includes examples of the technology. It is, of course, not possible to describe every conceivable combination of components or methodologies for purposes of describing the subject disclosure, but one of ordinary skill in the art may recognize that many further combinations and permutations of the specification are possible. Accordingly, the technology is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. An error-detection method, comprising: detecting a first error in a symbol transmitted on a first lane of a plurality of lanes utilizing a parity-check matrix;

rotating a plurality of data-bit columns of the parity-check matrix so that different column values in the parity-check matrix are employed to protect additional symbols transmitted in the first lane, the act of rotating comprises rotating the plurality of data-bit columns of the parity-check matrix by a number of bit-positions in a lane so that when the parity-check matrix is applied to a subsequent transmission character, all columns in the lane are unique compared to columns employed in the lane in connection with a preceding transmission character; and detecting a second error in a second symbol transmitted in the first lane using the rotated parity-check matrix.

2. The method of claim 1, the acts of detecting a first error and detecting a second error comprises establishing a non-zero syndrome.

3. The method of claim 1, further comprising generating the parity-check matrix with a rotatable property.

4. The method of claim 2, the act of generating the parity-check matrix comprises:

selecting a plurality of column values;

generating a permutation of a subset of the column values;

generating a matrix based upon the permutation;

determining a number of undetected error patterns for the matrix; and recording the number of undetected error patterns.

* * * * *

UNITED STATES PATENT AND TRADEMARK OFFICE
CERTIFICATE OF CORRECTION

| | | |
|---|---|---|
| PATENT NO. | : 7,657,821 B1 | Page 1 of 1 |
| APPLICATION NO. | : 11/467236 | |
| DATED | : February 2, 2010 | |
| INVENTOR(S) | : Wakerly et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 670 days.

Signed and Sealed this

Twenty-eighth Day of December, 2010

David J. Kappos
*Director of the United States Patent and Trademark Office*